(12) United States Patent
Kim et al.

(10) Patent No.: US 10,177,274 B2
(45) Date of Patent: Jan. 8, 2019

(54) RED LIGHT EMITTING DIODE AND LIGHTING DEVICE

(71) Applicant: LG INNOTEK CO., LTD., Seoul (KR)

(72) Inventors: Yong Jun Kim, Seoul (KR); Sung Wook Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/538,936

(22) PCT Filed: Nov. 19, 2015

(86) PCT No.: PCT/KR2015/012511
§ 371 (c)(1),
(2) Date: Jun. 22, 2017

(87) PCT Pub. No.: WO2016/104958
PCT Pub. Date: Jun. 30, 2016

(65) Prior Publication Data
US 2017/0358706 A1    Dec. 14, 2017

(30) Foreign Application Priority Data

Dec. 23, 2014 (KR) .................. 10-2014-0187285

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0025* (2013.01); *H01L 33/0079* (2013.01);
(Continued)

(58) Field of Classification Search
CPC . H01L 33/06; H01L 33/0025; H01L 33/0079; H01L 33/04; H01L 33/30; H01L 33/32; H01L 33/405; H01L 33/22
See application file for complete search history.

(56) References Cited

U.S. PATENT DOCUMENTS 5,459,746 A * 10/1995 Itaya .................. H01S 5/18308
                                              372/50.11
5,719,892 A *  2/1998 Jiang .................. H01S 5/18377
                                              372/45.01
(Continued)

FOREIGN PATENT DOCUMENTS

JP      2007-27294 A    2/2007
JP      2014-160872 A   9/2014
(Continued)

OTHER PUBLICATIONS

International Search Report, issued in PCT/KR2015/012511, dated Mar. 18, 2016.

*Primary Examiner* — Fazli Erdem
(74) *Attorney, Agent, or Firm* — Birch, Stewart, Kolasch & Birch, LLP (57) ABSTRACT

A red light emitting device, a fabricating method of the light emitting device, a light emitting device package and a lighting system are provided. The red light emitting device according to an embodiment may include a first conductive type first semiconductor layer 112; an active layer 114 on the first conductive type first semiconductor layer 112; a second conductive type third semiconductor layer 116 on the active layer 114; a second conductive type fourth semiconductor layer 124 on the second conductive type third semiconductor layer 116; and a second conductive type fifth semiconductor layer 125 on the second conductive type fourth semiconductor layer 124. The second conductive type fifth semi-
(Continued)

conductor layer 125 may include a superlattice structure of a GaP layer 125*a*/In$_x$Ga$_{1-x}$P layer (0≤x≤1) 125*b*.

5 Claims, 6 Drawing Sheets

(51) Int. Cl.
  *H01L 33/32*  (2010.01)
  *H01L 33/40*  (2010.01)
  *H01L 33/04*  (2010.01)
  *H01L 33/30*  (2010.01)
  *H01L 33/22*  (2010.01)

(52) U.S. Cl.
  CPC ............. *H01L 33/04* (2013.01); *H01L 33/30* (2013.01); *H01L 33/32* (2013.01); *H01L 33/405* (2013.01); *H01L 33/22* (2013.01)

(56) References Cited

U.S. PATENT DOCUMENTS

| | | | |
|---|---|---|---|
| 2002/0008243 A1 | 1/2002 | Goetz et al. | |
| 2002/0030197 A1* | 3/2002 | Sugawara | H01L 33/0079 257/103 |
| 2002/0104996 A1* | 8/2002 | Kuo | H01L 33/0062 257/79 |
| 2002/0139984 A1* | 10/2002 | Sugawara | H01L 33/08 257/79 |
| 2007/0284607 A1* | 12/2007 | Epler | H01L 33/16 257/103 |
| 2008/0149942 A1 | 6/2008 | Yi et al. | |
| 2009/0010290 A1* | 1/2009 | Mayer | B82Y 20/00 372/45.011 |
| 2009/0173956 A1 | 7/2009 | Aldaz et al. | |
| 2009/0278142 A1* | 11/2009 | Watanabe | H01L 21/6835 257/89 |
| 2010/0308211 A1* | 12/2010 | Cho | H01L 27/14625 250/214 R |
| 2011/0241065 A1* | 10/2011 | Jeong | H01L 33/20 257/99 |
| 2013/0092896 A1* | 4/2013 | Ledentsov | H01L 33/04 257/13 |
| 2014/0166975 A1* | 6/2014 | Ito | H01L 33/22 257/13 |
| 2015/0255669 A1 | 9/2015 | Han et al. | |

FOREIGN PATENT DOCUMENTS

| | | |
|---|---|---|
| KR | 10-2009-0019885 A | 2/2009 |
| KR | 10-2009-0068364 A | 6/2009 |
| KR | 10-2009-0074359 A | 7/2009 |
| KR | 10-2010-0099286 A | 9/2010 |
| KR | 10-2014-0036022 A | 3/2014 |
| KR | 10-2014-0039644 A | 4/2014 |
| KR | 10-2014-0090800 A | 7/2014 |
| KR | 10-2014-0099619 A | 8/2014 |

\* cited by examiner

Mg Doping Level

RED LIGHT EMITTING DIODE AND LIGHTING DEVICE

CROSS REFERENCE TO RELATED APPLICATIONS

This application is the National Phase of PCT International Application No. PCT/KR2015/012511, filed on Nov. 19, 2015, which claims priority under 35 U.S.C. 119(a) to Patent Application No. 10-2014-0187285, filed in the Republic of Korea on Dec. 23, 2014, all of which are hereby expressly incorporated by reference into the present application.

TECHNICAL FIELD

The embodiment relates to a red light emitting device, a fabricating method of the light emitting device, a light emitting device package and a lighting system.

BACKGROUND ART

A light emitting diode (LED) is a p-n junction diode having a characteristic in which electric energy is converted into light energy, may be produced by combining dopants of semiconductor compounds on the periodic table and may represent various colors of a blue LED, a green LED, an UV LED, or a red LED or the like by adjusting the compositional ratio of the semiconductor compounds.

For example, a red LED may include an AlGaInP-based LED, which may convert the injected electric energy into light having a wavelength in the range of about 570 nm to about 630 nm. The wavelength variation depends on an intensity of band gap energy of the LED, and the intensity of the band gap energy may be adjusted by adjusting a composition ratio of Al and Ga, and the wavelength may be shortened as the compositional ratio of Al is increased.

Meanwhile, recently, an application area of the AlGaInP-based red LEDs has been expanded to a light source for high color rendering index (high CRI) or a light source for a vehicle, and a market competition according thereto is intensifying, and thus ensuring high optical power or electrical reliability has been raised as an important issue.

DISCLOSURE

Technical Problem

The embodiment is directed to providing a red light emitting device capable of representing higher optical power, a fabricating method of the light emitting device, a light emitting device package and a lighting system.

In addition, the embodiment is directed to providing a red light emitting device capable of representing high reliability, a fabricating method of the light emitting device, a light emitting device package and a lighting system.

Technical Solution

According to the embodiment, a red light emitting device may include a first conductive type first semiconductor layer 112; an active layer 114 on the first conductive type first semiconductor layer 112; a second conductive type third semiconductor layer 116 on the active layer 114; a second conductive type fourth semiconductor layer 124 on the second conductive type third semiconductor layer 116; and a second conductive type fifth semiconductor layer 125 on the second conductive type fourth semiconductor layer 124. The second conductive type fifth semiconductor layer 125 may include a superlattice structure of a GaP layer 125a/In$_x$Ga$_{1-x}$P layer (0≤x≤1) 125b.

In addition, according to the embodiment, a red light emitting device may include a first semiconductor layer 112 of an n-type AlInGaP series; an active layer 114 on the first semiconductor layer 112 of the n-type AlInGaP series; a third semiconductor layer 116 of a p-type AlInGaP series on the active layer 114; a fourth semiconductor layer 124 of a p-type GaInP series layer on the third semiconductor layer 116 of the p-type AlInGaP series; and a fifth semiconductor layer 125 of a p-type GaP series on the fourth semiconductor layer 124 of the p-type GaInP series layer. The fifth semiconductor layer 125 of the p-type GaP series may include a superlattice structure of a GaP layer 125a/In$_x$Ga$_{1-x}$P layer (0≤x≤1) 125b.

According to the embodiment, a lighting system may include a light emitting unit having the red light emitting device.

Advantageous Effects

The embodiment may provide a red light emitting device capable of representing higher optical power, a fabricating method of the light emitting device, a light emitting device package and a lighting system.

In addition, the embodiment may provide a red light emitting device capable of representing high reliability, a fabricating method of the light emitting device, a light emitting device package and a lighting system.

BEST MODES

In the description of embodiments, it will be understood that when a layer (or film), region, pattern or structure is referred to as being "on/over" or "under" another layer (or film), region, pattern or structure, the terminology of "on/over" and "under" includes both the meanings of "directly" or "by interposing another layer (indirectly)". Further, the reference about "on/over" and "under" each layer will be made on the basis of drawings.

EMBODIMENTS

Figure 1:
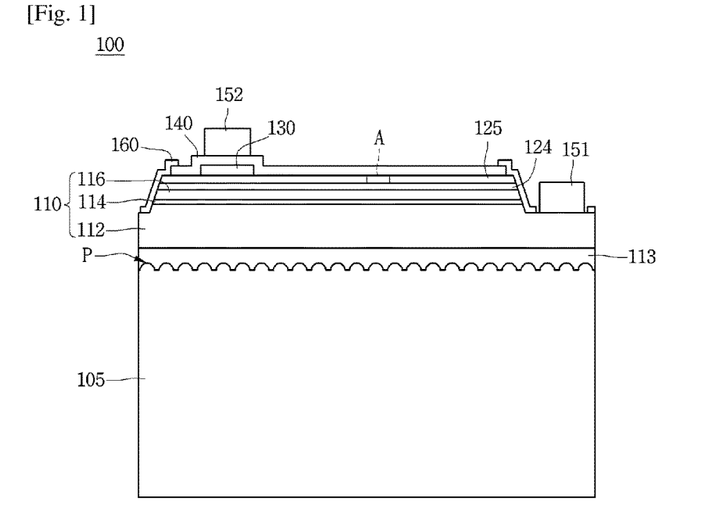
FIG. 1 is a cross-sectional view of a red light emitting device according to a first embodiment.

FIG. 1 is a cross-sectional view of a red light emitting device 101 according to a first embodiment.

The red light emitting device 101 according to the first embodiment may include a first conductive type first semiconductor layer 112, an active layer 114 on the first conductive type first semiconductor layer 112, a second conductive type third semiconductor layer 116 on the active layer 114, a second conductive type fourth semiconductor layer 124 on the second conductive type third semiconductor layer 116 and a second conductive type fifth semiconductor layer 125 on the second conductive type fourth semiconductor layer 124. Reference numbers, which are not described, among components of FIG. 1 will be described in the following fabricating method.

According to the red light emitting device of the prior art, there is a problem that a magnesium (Mg) diffusion phenomenon of a p-type GaP window layer occurs and luminous intensity (Po) is lowered. Therefore, there is a need for a method for preventing the Mg diffusion phenomenon to improve the luminous intensity.

Figure 2:
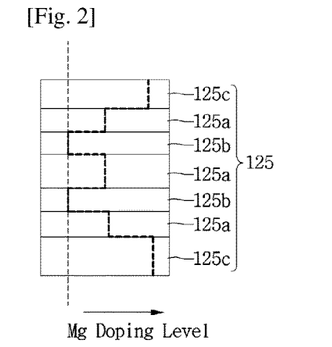
FIG. 2 is a partial enlarged view of the red light emitting device according to the first embodiment.
Figure 3:
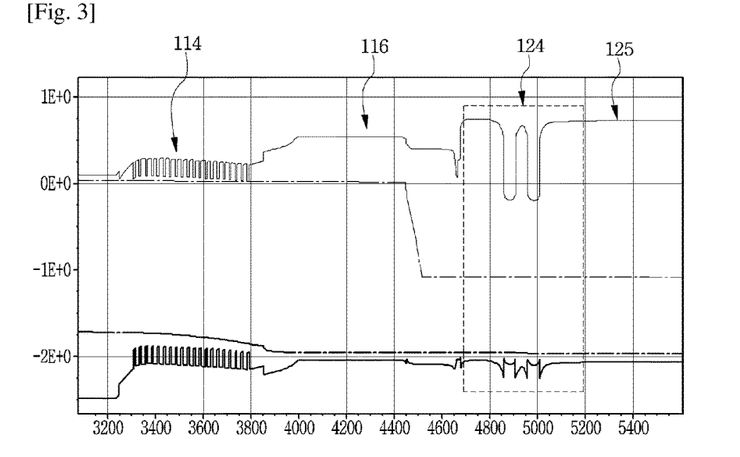
FIG. 3 is an energy band diagram of the red light emitting device according to the first embodiment.

FIG. 2 is an enlarged view of an A region (referring to FIG. 1) in the red light emitting device 100 according to the first embodiment, and FIG. 3 is an energy band diagram of the red light emitting device 100 according to the first embodiment.

Referring to FIG. 2, in the first embodiment, the second conductive type fifth semiconductor layer 125 may include a GaP material, and the second conductive type fifth semiconductor layer 125 may include a superlattice structure of a GaP layer 125$a$/In$_x$Ga$_{1-x}$P layer ($0 \leq x \leq 1$) 125$b$. The second conductive type fifth semiconductor layer 125 may include a third GaP layer 125$c$ doped with a second conductive type dopant. The second conductive type dopant may be a p-type conductive type dopant, but the embodiment is not limited thereto.

The second conductive type fifth semiconductor layer 125 may be doped with a second conductive type dopant having a first concentration, and the GaP layer 125$a$ may be doped with a second conductive type dopant having a concentration lower than the first concentration. The In$_x$Ga$_{1-x}$P layer ($0 \leq x \leq 1$) 125$b$ may not be doped with the second conductive type dopant.

For example, the second conductive type fifth semiconductor layer 125 may be doped with Mg having a concentration of about $10 \times 10^{18}$, and the GaP layer 125$a$ may be doped with Mg having a concentration of $10 \times 10^{17}$ and the In$_x$Ga$_{1-x}$P layer ($0 \leq x \leq 1$) 125$b$ may not be doped with the second conductive type dopant, but the embodiment is not limited thereto.

Accordingly, as shown in FIG. 3, the second conductive type fifth semiconductor layer 125 may have the superlattice structure of the GaP layer 125$a$/In$_x$Ga$_{1-x}$P layer ($0 \leq x \leq 1$) 125$b$, and the In$_x$Ga$_{1-x}$P layer ($0 \leq x \leq 1$) 125$b$ may represent a lower energy level, and the GaP layer 125$a$ may represent a higher energy level than an energy level of the In$_x$Ga$_{1-x}$P layer ($0 \leq x \leq 1$) 125$b$.

Figure 4:
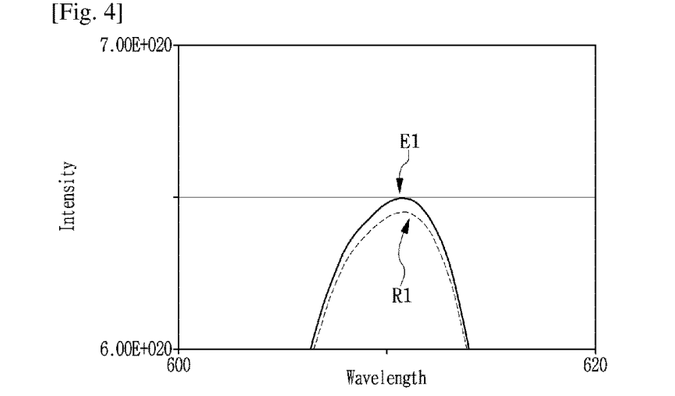
FIG. 4 is a luminous intensity data of the red light emitting device according to the first embodiment.

FIG. 4 illustrates luminous intensity data E1 of the red light emitting device according to the first embodiment.

When the first embodiment is applied, the luminous intensity E1 of the first embodiment is increased about 1.5% or more as compared with luminous intensity data R1 of a comparative example.

According to the embodiment, the second conductive type fifth semiconductor layer 125 functions as a p-type GaP window layer, and a Mg trapping function according to the superlattice structure of the Mg modulation-doped GaP layer 125$a$/In$_x$Ga$_{1-x}$P layer ($0 \leq x \leq 1$) 125$b$ is enhanced and the luminous intensity and reliability of the light emitting device chip may be increased.

Figure 5:
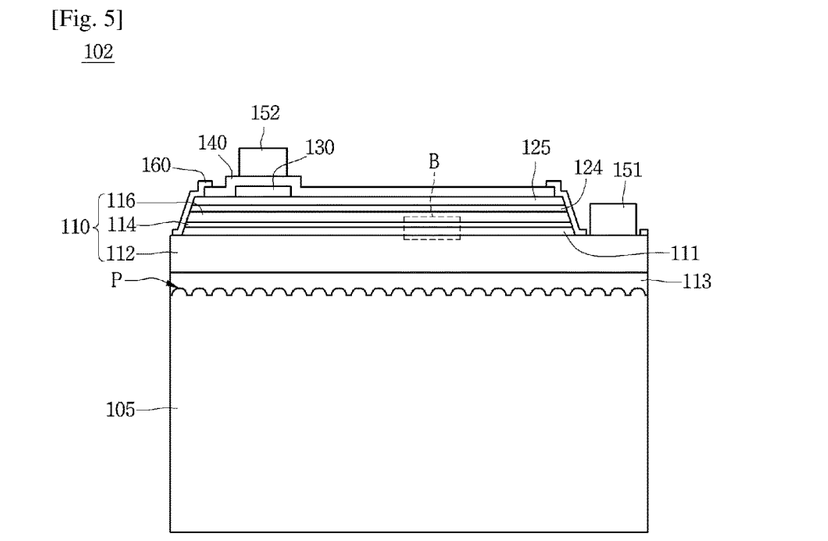
FIG. 5 is a cross-sectional view of a red light emitting device according to a second embodiment.
Figure 6:
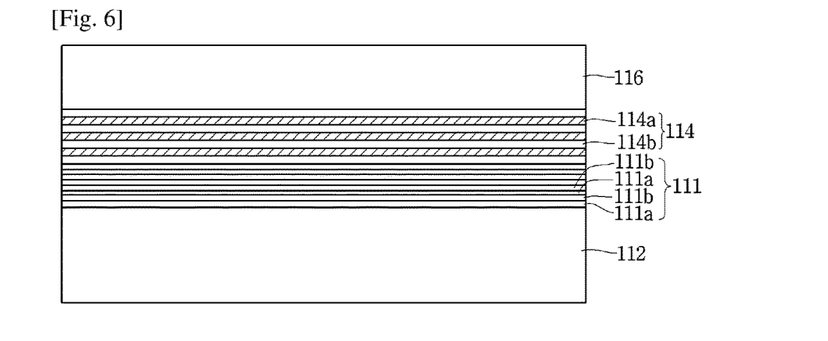
FIG. 6 is a partial enlarged view of the red light emitting device according to the second embodiment.

FIG. 5 is a cross-sectional view of a red light emitting device 102 according to a second embodiment, and FIG. 6 is an enlarged view of a B area of the red light emitting device according to the second embodiment.

The second embodiment may adopt the technical features of the first embodiment.

For example, the second conductive type fifth semiconductor layer 125 may include a GaP material, and the second conductive type fifth semiconductor layer 125 may include a superlattice structure of a GaP layer 125$a$/In$_x$Ga$_{1-x}$P layer ($0 \leq x \leq 1$) 125$b$.

The second conductive type fifth semiconductor layer 125 may be doped with the second conductive type dopant having the first concentration, and the GaP layer 125$a$ may be doped with the second conductive type dopant having a concentration lower than the first concentration. The In$_x$Ga$_{1-x}$P layer ($0 \leq x \leq 1$) 125$b$ may not be doped with the second conductive type dopant.

Hereinafter, the main features of the second embodiment will be described below.

In the red light emitting device of the prior art, an operating voltage tends to drop when temperature rises due to the characteristic of the LED, but there is a problem that the luminous intensity drops.

In the red light emitting device, as a cause of the luminous intensity decrease according to the increase in the temperature (Temp), it is analyzed that dopants are ionized to lower resistance, while a recombination rate is lowered in an active layer region and the luminous intensity decrease phenomenon occurs, and it is understood that the ionization speed of electrons compared to that of the hole is accelerated, so that the luminous intensity decrease according to the temperature increase is further accelerated.

Accordingly, the second embodiment further includes a first conductive type second semiconductor layer 111 on the first conductive type first semiconductor layer 112 to solve the above problem.

For example, as shown in FIG. 6, the first conductive type first semiconductor layer 112 may include an n-type AlInGaP series layer, and the first conductive type second semiconductor layer 111 may include a superlattice structure of an AlInP series layer 111$b$/AlInGaP series layer 111$a$. The active layer 114 may include a well layer 114$a$/barrier layer 114$b$ structure.

The superlattice structure of the AlInP series layer 111$b$/AlInGaP series layer 111$a$ may be formed in a range of about 10 pairs to about 14 pairs, but the embodiment is not limited thereto. When it is less than 10 pairs, the contribution to the luminous intensity improvement may be insufficient, and when the pair is over 14, the electron mobility may be excessively lowered, which may adversely affect the luminous intensity.

Figure 7A:
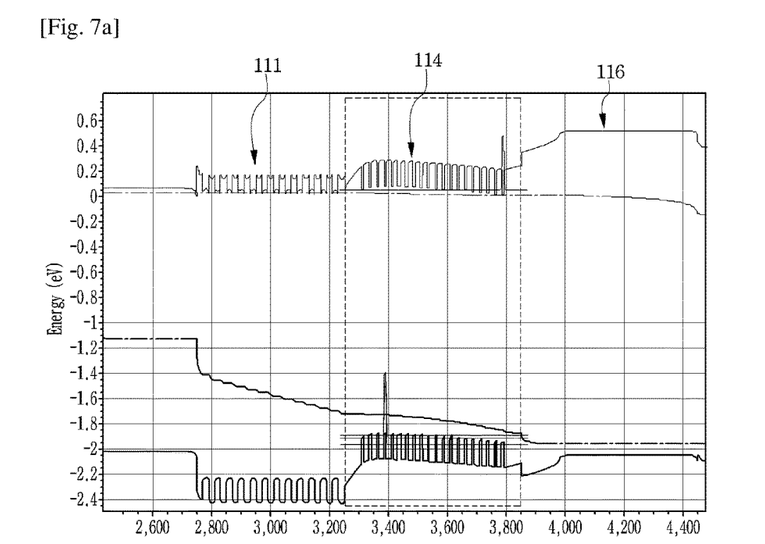
FIG. 7a is an energy band diagram of the red light emitting device according to the second embodiment.
Figure 7B:
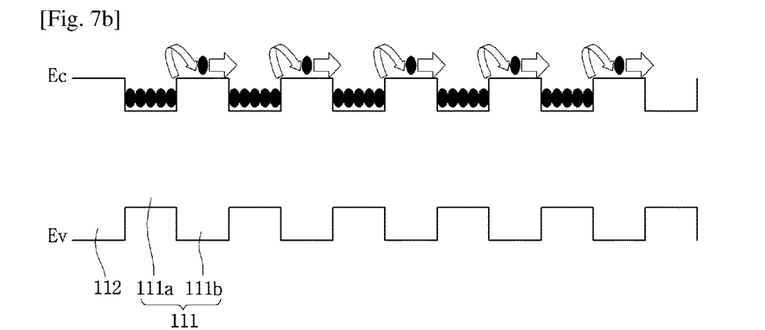
FIG. 7b is a functional schematic diagram of a second semiconductor layer in the red light emitting device according to the second embodiment.

FIG. 7$a$ is an energy band diagram of the red light emitting device according to the second embodiment, FIG. 7$b$ is a functional schematic diagram of a second semiconductor layer 111 in the red light emitting device according to the second embodiment. As shown in FIG. 7a, the second embodiment includes the first conductive type second semiconductor layer 111 under the lower side of the active layer 114, the electrons are cooled in the second semiconductor layer 111, and further more radiation recombination in the active layer 114 may be produced.

Figure 8:
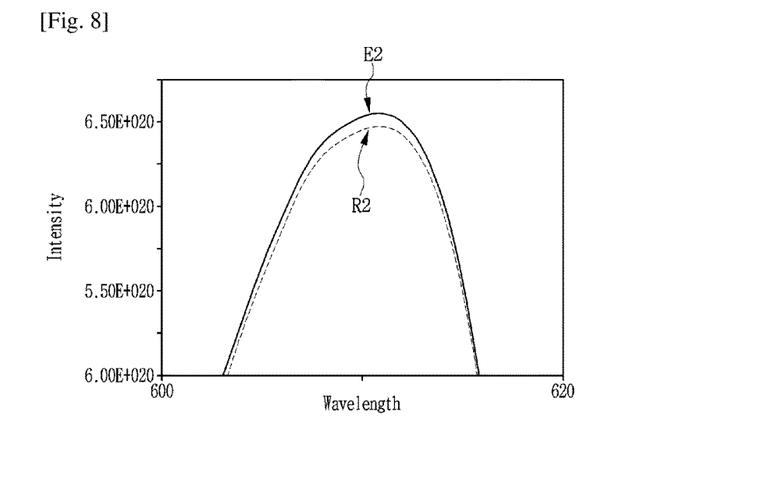
FIG. 8 is a luminous intensity data of the red light emitting device according to the second embodiment.

FIG. 8 illustrates luminous intensity data of the red light emitting device according to the second embodiment.

In the second embodiment, luminous intensity E2 of the second embodiment is increased about 1.2% or more as compared with luminous intensity data R2 of the comparative example.

According to the second embodiment, the AlInP series layer 111b has an Eg of about 2.6 eV, and in the case in which the AlInGaP series layer 111a is, for example, $Al_{0.6}Ga_{0.4}InP$, Eg decreases to about 2.25 eV, and when electrons are ionized, the electrons are cooled in the AlInGaP series layer 111a region having a small Eg in the superlattice structure, so that further more radiation recombination may be generated in the active layer 114, thereby contributing to minimizing the luminous intensity decrease when the temperature is increased.

Figure 9:
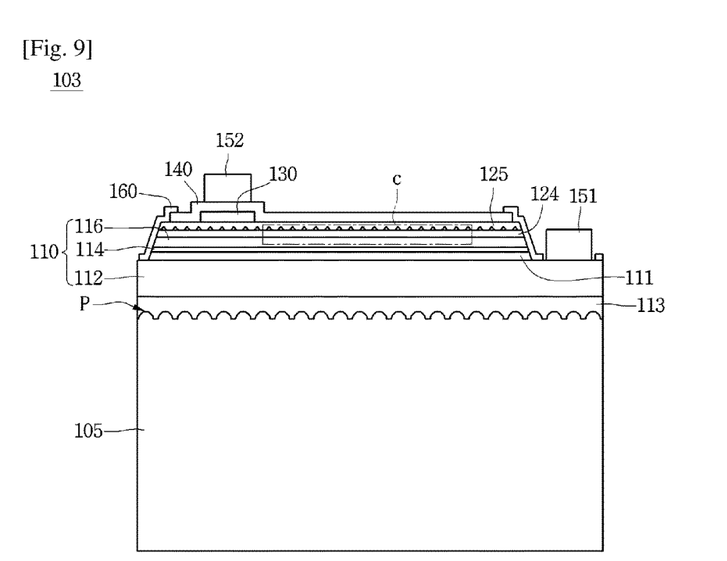
FIG. 9 is a cross-sectional view of a red light emitting device according to a third embodiment.
Figure 10:
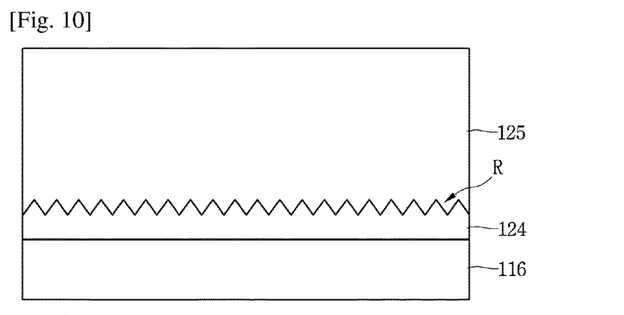
FIG. 10 is a partial enlarged view of the red light emitting device according to the third embodiment.

FIG. 9 is a cross-sectional view of a red light emitting device according to a third embodiment, and FIG. 10 is an enlarged view of a C area of the red light emitting device according to the third embodiment.

A red light emitting device 103 according to the third embodiment may include a first semiconductor layer 112 of an n-type AlInGaP series, an active layer 114 on the first semiconductor layer 112 of the n-type AlInGaP series, a third semiconductor layer 116 of a p-type AlInGaP series on the active layer 114, a fourth semiconductor layer 124 of a p-type GaInP series layer on the third semiconductor layer 116 of the p-type AlInGaP series and a fifth semiconductor layer 125 of a p-type GaP series on the fourth semiconductor layer 124 of the p-type GaInP series layer.

The third embodiment may adopt the technical features of the first embodiment or the second embodiment.

For example, the fifth semiconductor layer 125 of the p-type GaP series may include a superlattice structure of a GaP layer 125a/$In_xGa_{1-x}P$ layer (0≤x≤1) 125b.

The fifth semiconductor layer 125 of the p-type GaP series may be doped with a p-type dopant having a first concentration, and the GaP layer 125a may be doped with a p-type dopant having a concentration lower than that the first concentration. The $In_xGa_{1-x}P$ layer (0≤x≤1) 125b may not be doped with the p-type dopant.

In addition, a n-type second semiconductor layer 111 may be further formed on the first semiconductor layer 112 of the n-type AlInGaP series. The n-type second semiconductor layer 111 may include a superlattice structure of an AlInP series layer 111b/AlInGaP series layer 111a.

Hereinafter, the main features of the third embodiment will be described below.

According to the prior art, the GaP window layer is subjected to a tensile stress of about 3% due to the difference in lattice constant with a p-type clad layer, and the tensile stress cause an internal defect or dislocation, which adversely affects reliability or current spreading.

In order to solve these problems, the third embodiment may include the fourth semiconductor layer 124 between the third semiconductor layer 116 and the fifth semiconductor layer 125. The third semiconductor layer 116 may include a p-type AlInGaP series layer, the fourth semiconductor layer 124 may include a p-type GaInP series layer, and the fifth semiconductor layer 125 may include a p-type GaP series layer.

The fourth semiconductor layer 124 may include a p-type $Ga_{0.7}In_{0.3}P$ layer, but the embodiment is not limited thereto.

According to the embodiment, the fourth semiconductor layer 124 including a material of an intermediate region between those of the third semiconductor layer 116 and the fifth semiconductor layer 125 may reduce the strain in the fifth semiconductor layer 125 about 1.5%, and it may improve the reliability and the luminous intensity.

In addition, in the third embodiment, a predetermined pattern R is formed on an upper surface of the fourth semiconductor layer 124 to increase a contact area with the fifth semiconductor layer 125, thereby minimizing the tensile stress.

Hereinafter, a fabricating method of the red light emitting device according to an embodiment will be described with reference to FIGS. 11 to 14. The description of the fabricating method will be described with reference to the drawing of the first embodiment, but the features of the second embodiment or the third embodiment will also be described as necessary.

Figure 11:
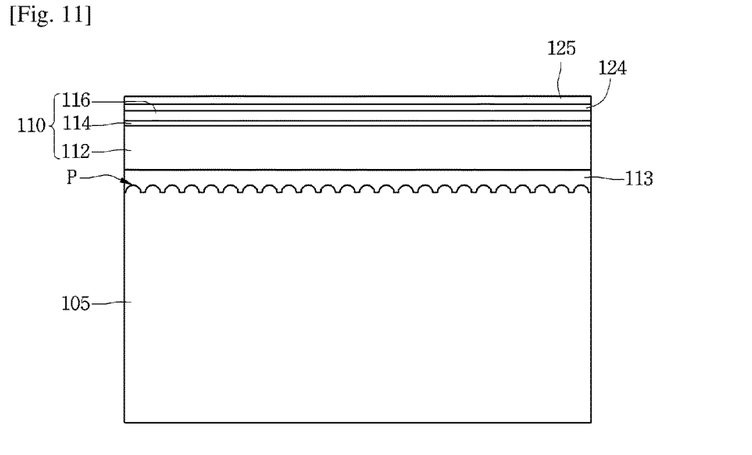
FIGS. 11 to 14 are process sectional views of a fabricating method of a red light emitting device according to the embodiment.

First, a substrate 105 is prepared as shown in FIG. 11. The substrate 105 may be formed of a material having excellent thermal conductivity, and it may be a conductive substrate or an insulating substrate. For example, the substrate 105 may use at least one of GaAs, sapphire ($Al_2O_3$), SiC, Si, GaN, ZnO, GaP, InP, Ge, and $Ga_2O_3$. A concavo-convex structure P may be formed on the substrate 105, but is not limited thereto. The substrate 105 may be wet-cleaned to remove impurities on the surface.

A buffer layer 113 may be formed on the substrate 105. The buffer layer 113 may mitigate lattice mismatch between the material of a light emitting structure 110 and the substrate 105, and the material of the buffer layer 113 may be formed at least one of Group III-V compound semiconductors such as GaN, InN, AlN, InGaN, AlGaN, InAlGaN, and AlInN. An undoped semiconductor layer (not shown) may be formed on the buffer layer 113, but the embodiment is not limited thereto.

Hereinafter, the light emitting structure 110 including the first conductive type first semiconductor layer 112, the active layer 114 and the second conductive type third semiconductor layer 116 may be formed on the substrate 105 or the buffer layer 113.

The first conductive type first semiconductor layer 112 may be formed of a semiconductor compound, for example, a compound semiconductor of group III-V elements, group II-VI elements or the like, and may be doped with a first conductive type dopant. In the case in which the first conductive type first semiconductor layer 112 is an n-type semiconductor layer, it may include Si, Ge, Sn, Se, and Te as n-type dopant, but the embodiment is not limited thereto.

The first conductive type first semiconductor layer 112 may include a semiconductor material having a composition formula of $In_xAl_yGa_{1-x-y}P$ (0≤x≤1, 0≤y≤1, 0≤x+y≤1) or $In_xAl_yGa_{1-x-y}N$ (0≤x≤1, 0≤y≤1, 0≤x+y≤1).

The first conductive type first semiconductor layer 112 may be formed of any one or more of AlGaP, InGaP, AlInGaP, InP, GaN, InN, AlN, InGaN, AlGaN, InAlGaN, AlInN, AlGaAs, InGaAs, AlInGaAs, and GaP.

The first conductive type first semiconductor layer 112 may be formed using a chemical vapor deposition (CVD) method or a molecular beam epitaxy (MBE) method or a sputtering method or a hydride vapor phase epitaxy (HYPE) method, but the embodiment is not limited thereto.

Next as shown in FIGS. 5 and 6, the first conductive type second semiconductor layer 111 may be further formed between the first conductive type first semiconductor layer 112 and the active layer 114.

For example, the first conductive type first semiconductor layer 112 may include an n-type AlInGaP series layer, and the first conductive type second semiconductor layer 111 may include a superlattice structure of an AlInP series layer 111b/AlInGaP series layer 111a.

The superlattice structure of the AlInP series layer 111b/AlInGaP series layer 111a may be formed in a range of 10 pairs to 14 pairs, but is not limited thereto. When it is less than 10 pairs, the contribution to the luminous intensity enhancement may be insignificant, and when pair has over 14, the electron mobility may excessively be degraded, which may have a negative effect on the luminous intensity.

According to the embodiment, when the electrons are ionized, the electrons are cooled in the superlattice structure of the AlInP series layer 111b/AlInGaP series layer 111a, so that more radiation recombination may be generated in the active layer 114, and the luminous intensity may be improved.

Next, the active layer 114 is formed on the first conductive type first semiconductor layer 112 or the first conductive type second semiconductor layer 111.

The active layer 114 is a layer in which the electrons injected through the first conductive type first semiconductor layer 112 and holes injected through the second conductive type third semiconductor layer 116 formed thereafter mutually meet so as to emit light having energy to be determined by the inherent energy band of the active layer (light emitting layer) material.

The active layer 114 may be formed of at least one of a single quantum well structure, a multi quantum well (MQW) structure, a quantum-wire structure, and a quantum dot structure.

The active layer 114 may include a well layer 114a/barrier layer 114b structure. For example, the active layer 114 may be formed of any one of pairs of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs but is not limited thereto. The well layer 114a may be formed of a material having a band gap lower than a band gap of the barrier layer 114b.

Next, the second conductive type third semiconductor layer 116 may be formed of a semiconductor compound. It may be implemented as a compound semiconductor of group III-V elements, group II-VI elements, or the like and the second conductive type dopant may be doped.

For example, the second conductive type third semiconductor layer 116 may include a semiconductor material having a composition formula of $In_xAl_yGa_{1-x-y}P$ ($0 \leq x \leq 1$, $0 \leq y \leq 1$, $0 \leq x+y \leq 1$) or $In_xAl_yGa_{1-x-y}N$ ($0 \leq x \leq 1$, $0 \leq y \leq 1$, $0 \leq x+y \leq 1$). In the case in which the second conductive type third semiconductor layer 116 is a p-type semiconductor layer, it may include Mg, Zn, Ca, Sr, or Ba as the p-type dopant.

In the embodiment, the first conductive type first semiconductor layer 112 may be an n-type semiconductor layer, and the second conductive type third semiconductor layer 116 may be a p-type semiconductor layer, but is not limited thereto. For example, in the embodiment, the first conductive type first semiconductor layer 112 may be a p-type semiconductor layer, and the second conductive type third semiconductor layer 116 may be an n-type semiconductor layer.

In addition, on the second conductive type third semiconductor layer 116, a semiconductor having polarity opposite to that of the second conductive type, for example, an n-type semiconductor layer (not shown) may be formed. Accordingly, the light emitting structure 110 may be implemented as any one of an n-p junction structure, a p-n junction structure, an n-p-n junction structure, and a p-n-p junction structure.

Next, the second conductive type fourth semiconductor layer 124 and the second conductive type fifth semiconductor layer 125 may be formed on the second conductive type third semiconductor layer 116.

The second conductive type third semiconductor layer 116 may include a p-type AlGaInP series layer, the second conductive type fourth semiconductor layer 124 may include a p-type GaInP series layer, and the second conductive type fifth semiconductor layer 125 may include a p-type GaP series layer. The second conductive type fourth semiconductor layer 124 may include a p-type $Ga_{0.7}In_{0.3}P$ layer, but the embodiment is not limited thereto.

According to the embodiment, as the second conductive type fourth semiconductor layer 124 including a material of an intermediate region between those of the second conductive type third semiconductor layer 116 and the second conductive type fifth semiconductor layer 125, the strain in the second conductive type fifth semiconductor layer 125 may be reduced to less than about 1.5% thereby improving the reliability and the luminous intensity.

In addition, as shown in FIG. 9 or FIG. 10, in the embodiment, a predetermined pattern R is formed on the upper surface of the second conductive type fourth semiconductor layer 124, so that the contact area with the second conductive type fifth semiconductor layer 125 may be increased to minimize the tensile stress.

Figure 12:
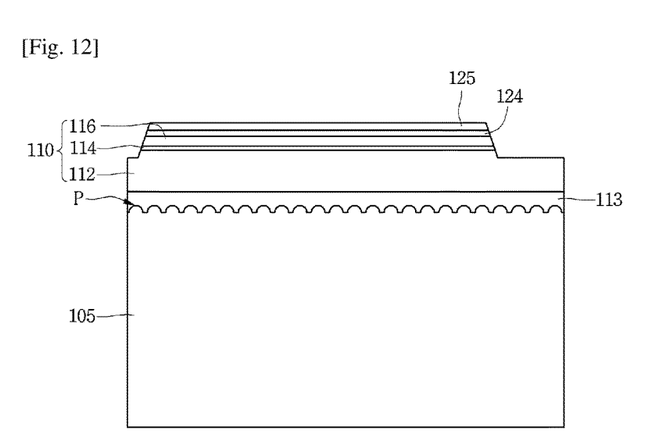

Next as shown in FIG. 12, a part of the structure disposed on the first conductive type first semiconductor layer 112 may be partially removed so that the first conductive type first semiconductor layer 112 is partially exposed. Such a process may be performed by wet etching or dry etching, but the embodiment is not limited thereto.

Figure 13:
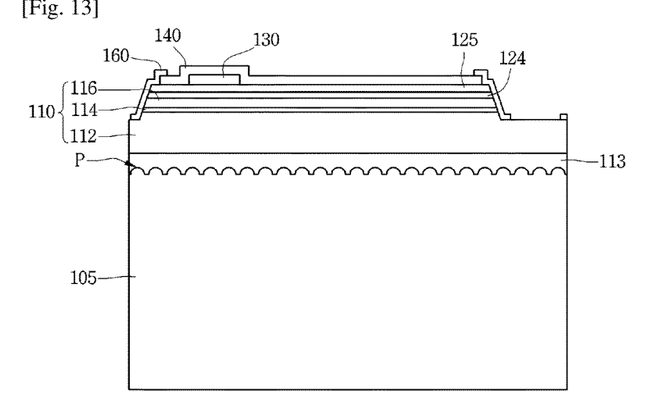

Next as shown in the FIG. 13, a current blocking layer 130 may be formed at a position where a second electrode 152 is to be formed. The current blocking layer 130 may be formed to include a non-conductive region, a first conductive type ion-implanted layer, a first conductive type diffusion layer, an insulator, an amorphous region, and the like.

Next, light transmitting electrode layer 140 may be formed on the second conductive type fifth semiconductor layer 125 on which the current blocking layer 130 is formed. The light transmitting electrode layer 140 may include an ohmic layer, and may be formed by stacking a single metal, a metal alloy, a metal oxide or the like in multiple layers so as to efficiently inject holes.

For example, the light transmitting electrode layer 140 may be formed of a material excellent in electrical contact with a semiconductor. For example, the light transmitting electrode layer 140 may be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOxJAu/ITO, Ag, Ni, Cr, Ti, Al, Rh, Pd, Ir, Ru, Mg, Zn, Pt, Au, and Hf, but is not limited these materials.

Then, a passivation layer 160 may be formed on a side surface of the light emitting structure 110 and a part of the light transmitting electrode layer 140 with an insulating layer or the like. The passivation layer 160 may expose a region where a first electrode 151 is to be formed.

Figure 14:
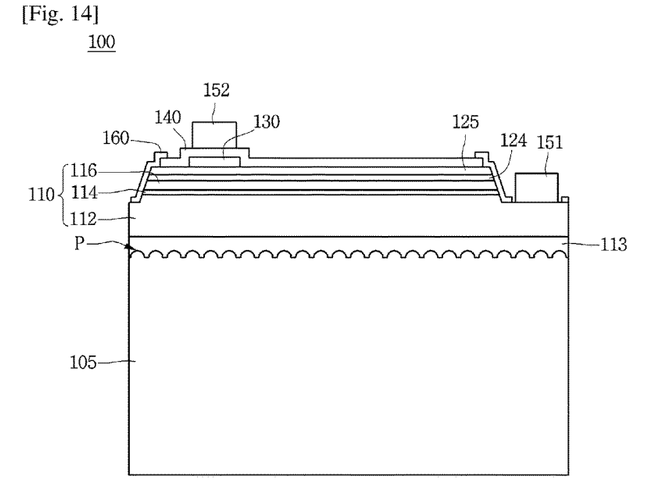

Next, as shown in FIG. 14, a second electrode 152 is formed on the light transmitting electrode layer 140 so as to overlap with the current blocking layer 130, and the first electrode 151 is formed on the exposed first conductive type first semiconductor layer 112 so that the red light emitting device according to the embodiment may be manufactured. The first electrode 151 or the second electrode 152 may be formed of at least any one of titanium (Ti), chromium (Cr), nickel (Ni), aluminum (Al), platinum (Pt), gold (Au), tungsten (W), and molybdenum (Mo), but the embodiment is not limited thereto.

A plurality of red light emitting devices according to the embodiment may be arrayed on a substrate in a package form, and a light guide plate, a prism sheet, a diffusion sheet, a phosphor sheet, etc. which are optical members may be disposed on the path of the light emitted from the light emitting device package.

Figure 15:
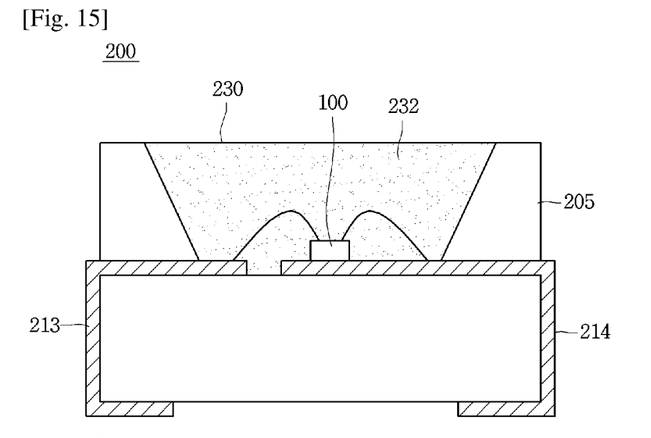
FIG. 15 is a cross-sectional view of a light emitting device package according to the embodiment.

FIG. 15 is a view illustrating a light emitting device package 200 in which the red light emitting device according to the embodiments is mounted.

The light emitting device package 200 according to the embodiment may include a package body part 205, a third electrode layer 213 and an a fourth electrode layer 214 mounted on the package body part 205, a red light emitting device 100 mounted on the package body part 205 and electrically connected with the third electrode layer 213 and the fourth electrode layer 214, and a molding member 230 having a phosphor 232 to surround the light emitting device 100.

The third electrode layer 213 and the fourth electrode layer 214 are electrically isolated from each other and serve to supply power to the red light emitting device 100. In addition, the third electrode layer 213 and the fourth electrode layer 214 may serve to increase the light efficiency by reflecting the light generated from the red light emitting device 100, and it may also serve to discharge heat generated from the red light emitting device 100 to the outside.

The red light emitting device 100 may be electrically connected w the third electrode layer 213 and/or the fourth electrode layer 214 by any one of a wire method, flip chip method and a die bonding method.

The red light emitting device according to the embodiment may be applied to a backlight unit, a lighting unit, a display device, an indicator, a lamp, a street lamp, a lighting device for a vehicle, a display device for a vehicle, and a smart watch, but is not limited thereto.

Figure 16:
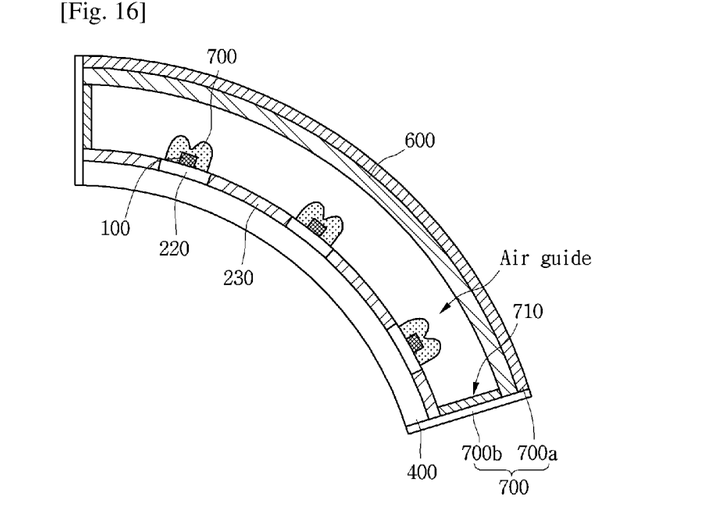
FIG. 16 is a cross-sectional view of a lighting apparatus according to the embodiment.

FIG. 16 is an exploded perspective view of a lighting system according to the embodiment.

The lighting apparatus according to the embodiment may include a cover 2100, a light source module 2200, a heat radiator 2400, a power supply part 2600, an inner case 2700, and a socket 2800. In addition, the lighting apparatus according to the embodiment may further include at least one of a member 2300 and a holder 2500. The light source module 2200 may include the light emitting device or light emitting device package according to the embodiment.

The light source module 2200 may include a light source part 2210, a connection plate 2230, and a connector 2250. The member 2300 is disposed on the upper surface of the heat radiator 2400 and has a guide groove 2310 into which a plurality of light source parts 2210 and the connector 2250 are inserted.

The holder 2500 closes a receiving groove 2719 of an insulating part 2710 of the inner case 2700. Therefore, the power supply part 2600 received in the insulating part 2710 of the inner case 2700 is sealed. The holder 2500 has a guide protrusion part 2510.

The power supply part 2600 may include a protrusion part 2610, a guide part 2630, a base 2650, and an extension part 2670. The inner case 2700 may include a molding part together with the power supply part 2600. The molding part is a portion formed by solidifying a molding liquid and fixes the power supply part 2600 into the inner case 2700.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a variation are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in embodiments may be varied. In addition, it should be construed that differences related to such a variation and such an application are included in the scope of the present invention defined in the following claims.

The invention claimed is:

1. A red light emitting device comprising:
   a first conductive type first semiconductor layer including AlInGaP;
   a first conductive type second semiconductor layer on the first conductive type first semiconductor layer and including a first superlattice structure, the first superlattice structure including a plurality of first series layers that includes AlInP and a plurality of second series layers alternately disposed between the plurality of first series layers and including AlInGaP, the plurality of second series layers having second bandgaps smaller than first band gas of the plurality of first series layers;
   an active layer on the first conductive type second semiconductor layer;
   a second conductive type third semiconductor layer on the active layer;
   a second conductive type fourth semiconductor layer on the second conductive type third semiconductor layer; and
   a second conductive type fifth semiconductor layer on the second conductive type fourth semiconductor layer, and including a second superlattice structure, the second superlattice structure including:
   a first series layer that includes GaP;
   a second series layer that includes GaP;
   a plurality of third series layers that are disposed between the first series layer and the second series layer and includes GaP; and
   a plurality of fourth series layers that are disposed between the plurality of third series layers and include InGaP, the first series layer and the second series layer including a second conductive type dopant that has a first concentration, the plurality of third series layers including the second conductive type dopant having a second concentration lower than the first concentration, and the plurality of fourth series layers not having the second conductive type dopant.

2. A red light emitting device comprising:
a first semiconductor layer including an n-type AlInGaP series material;
a second semiconductor layer on the first semiconductor layer and including a first superlattice structure, the first superlattice structure including a plurality of first series layers that includes AlInP and a plurality of second series layers alternately disposed between the plurality of first series layers and including AlInGaP, the plurality of second series layers having second bandgaps smaller than first band gaps of the plurality of first series layers;
an active layer on the second semiconductor layer;
a third semiconductor layer on the active layer, the third semiconductor layer including a p-type AlInGaP series material;
a fourth semiconductor layer on the third semiconductor layer, the fourth semiconductor layer including a p-type GaInP series material;
a fifth semiconductor layer on the fourth semiconductor layer, and including a second superlattice structure, the second superlattice structure including:
a first series layer that includes GaP;
a second series layer that includes GaP;
a plurality of third series layers that are disposed between the first series layer and the second series layer and includes GaP; and
a plurality of fourth series layers that are disposed between the plurality of third series layers and include InGaP, the first series layer and the second series layer including a p-type dopant that has a first concentration, the plurality of third series layers including the p-type dopant that has a second concentration lower than the first concentration, and the plurality of fourth series layers not having the p-type dopant; and
a pattern having a roughness and disposed between the fourth semiconductor layer and the fifth semiconductor layer.

3. The red light emitting device of claim 2, wherein the first superlattice structure has a range of 10 pair to 14 pair.

4. The red light emitting device of claim 2, wherein the fourth semiconductor layer has an upper surface contacting the pattern.

5. The red light emitting device of claim 4, wherein the fifth semiconductor layer has a lower surface contacting the pattern.

* * * * *